US012587312B2

(12) United States Patent
Farsiabi et al.

(10) Patent No.: US 12,587,312 B2
(45) Date of Patent: Mar. 24, 2026

(54) HYBRID PRODUCT POLAR CODES-BASED COMMUNICATION SYSTEMS AND METHODS

(71) Applicant: HUAWEI TECHNOLOGIES CO., LTD., Shenzhen (CN)

(72) Inventors: Ali Farsiabi, Kanata (CA); Hamid Ebrahimzad, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 415 days.

(21) Appl. No.: 17/965,171

(22) Filed: Oct. 13, 2022

(65) Prior Publication Data

US 2024/0137151 A1 Apr. 25, 2024

(51) Int. Cl.
*H03M 13/05* (2006.01)
*H03M 13/00* (2006.01)
*H04L 1/00* (2006.01)

(52) U.S. Cl.
CPC .......... *H04L 1/0057* (2013.01); *H03M 13/05* (2013.01); *H03M 13/611* (2013.01); *H04L 1/0071* (2013.01)

(58) Field of Classification Search
CPC .... H04L 1/0057; H04L 1/0071; H03M 13/05; H03M 13/611
See application file for complete search history.

(56) References Cited

U.S. PATENT DOCUMENTS

2017/0353267 A1\* 12/2017 Kudekar ............... H04L 1/0061
2018/0227076 A1\* 8/2018 Koike-Akino ...... H03M 13/353
(Continued)

OTHER PUBLICATIONS

T. Koike-Akino, C. Cao and Y. Wang, "Turbo Product Codes with Irregular Polar Coding for High-Throughput Parallel Decoding in Wireless OFDM Transmission," 2018 IEEE International Conference on Communications (ICC), 2018, pp. 1-7 Retrieved from https://ieeexplore.ieee.org/document/8422466 (Year: 2018).\*
(Continued)

*Primary Examiner* — Emmanuel L Moise
(74) *Attorney, Agent, or Firm* — BCF LLP

(57) ABSTRACT

The disclosed hybrid product polar codes-based communication systems and methods for i) receiving a stream of information bits; ii) reshaping the stream of information bits into at least a first rectangular information matrix $M_1$ of size $K_{r1} \times K_{c1}$ and a second rectangular information matrix $M_2$ of size $K_{r2} \times K_{c2}$; iii) converting the rectangular information matrices $M_1$ and $M_2$ to 2D product polar code encoded matrices $X_1$ and $X_2$ respectively using product polar codes, the 2D product polar code encoded matrices $X_1$ and $X_2$ having a size of $N_{r1} \times N_{c1}$ and $N_{r2} \times N_{c2}$ respectively; iv) converting the 2D product polar code encoded matrices $X_1$ and $X_2$ to a stream of encoded bits X'; and v) encoding the stream of encoded bits X' to a stream of polar encoded bits X" using the polar codes.

20 Claims, 10 Drawing Sheets

300

(56)                    References Cited

U.S. PATENT DOCUMENTS

| | | | |
|---|---|---|---|
| 2019/0036550 A1* | 1/2019 | Koike-Akino .... | H03M 13/2906 |
| 2021/0152187 A1* | 5/2021 | Li .................... | H03M 13/2778 |
| 2022/0247514 A1 | 8/2022 | Ebrahimzad et al. | |

OTHER PUBLICATIONS

Pyndiah, Ramesh "Near-Optimum Decoding of Product Codes: Block Turbo Codes" IEEE Transactions on Communications, Aug. 1998 (Year: 1998).*

E. Arikan, "Channel polarization: A method for constructing capacity achieving codes for symmetric binary-input memoryless channels," IEEE Trans. Inf. Theory, vol. 55, pp. 3051-3073, Jul. 2009.

I. Tal and A. Vardy, "List decoding of polar codes", IEEE Trans. IT, vol. 61, No. 5, pp. 2213-2226, Mar. 2015.

G. Sarkis, P. Giard, A. Vardy, C. Thibeault, and W. Gross, "Fast polar decoders: Algorithm and implementation," IEEE J. Sel. Areas Commun., vol. 32, No. 5, pp. 946-957, May 2014.

M. Hanif and M. Ardakani, "Fast successive-cancellation decoding of polar codes: Identification and decoding of new nodes," IEEE Commun. Lett., vol. 21, No. 11, pp. 2360-2363, Nov. 2017.

S. A. Hashemi, C. Condo, and W. J. Gross, "Simplified successive cancellation list decoding of polar codes," in IEEE Int. Symp. on Inform. Theory, Jul. 2016, pp. 815-819.

C. Condo, V. Bioglio, H. Hafermann and I. Land, "Practical Product Code Construction of Polar Codes," in IEEE Transactions on Signal Processing, vol. 68, pp. 2004-2014, 2020.

T. Koike-Akino, C. Cao and Y. Wang, "Turbo Product Codes with Irregular Polar Coding for High-Throughput Parallel Decoding in Wireless OFDM Transmission," 2018 IEEE International Conference on Communications (ICC), 2018, pp. 1-7.

M. Barakatain and F. R. Kschischang, Low-complexity concatenated LDPC-staircase codes, J. Lightw. Technol, Jun. 2018.

R. M. Pyndiah, "Near-optimum decoding of product codes: block turbo codes," IEEE Transactions on Communications, vol. 46, No. 8, pp. 1003-1010, Aug. 1998.

European Search Report issued in corresponding European application No. 23876723.0 on Nov. 6, 2025.

* cited by examiner

200

500

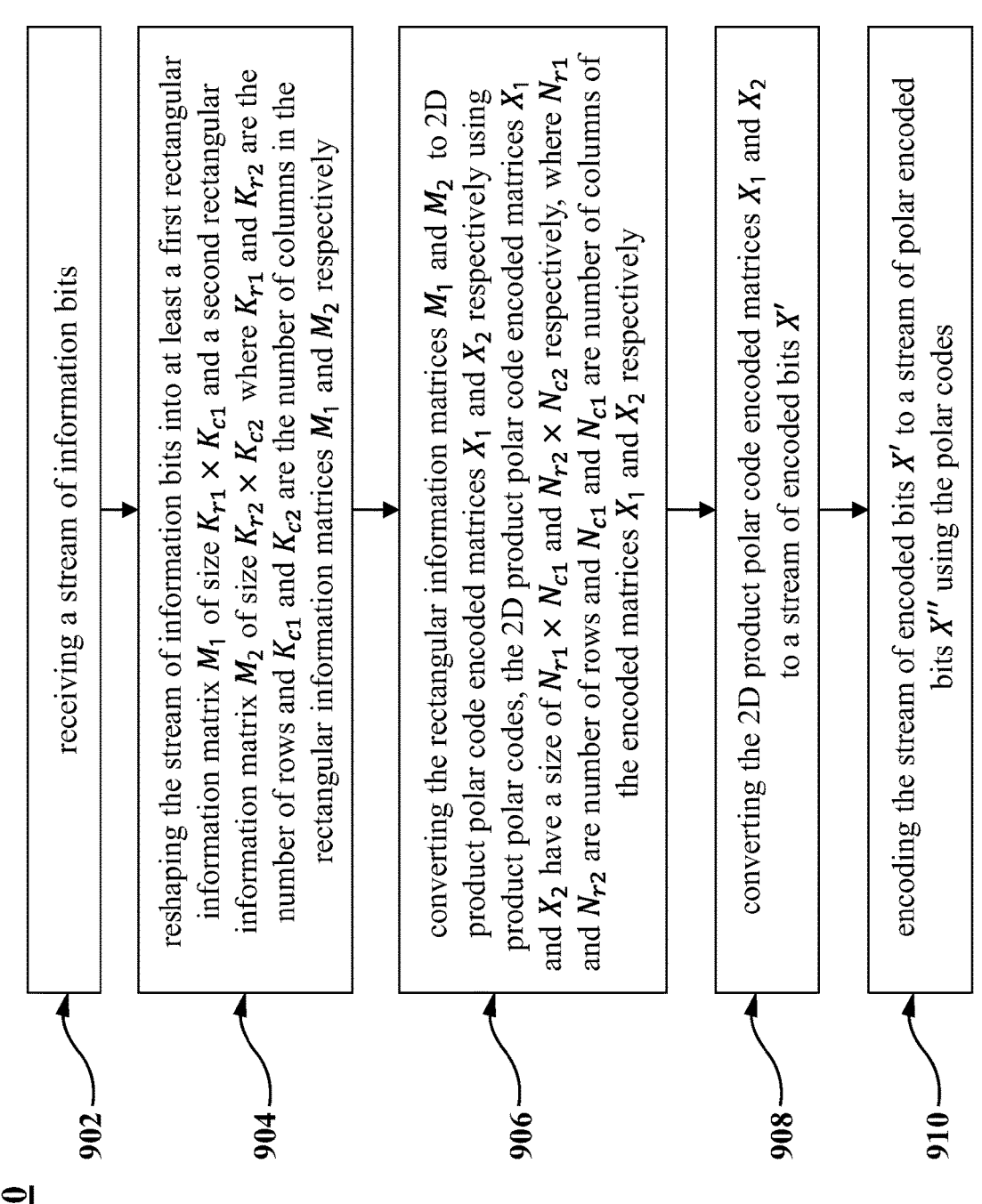

receiving a stream of information bits reshaping the stream of information bits into at least a first rectangular information matrix $M_1$ of size $K_{r1} \times K_{c1}$ and a second rectangular information matrix $M_2$ of size $K_{r2} \times K_{c2}$ where $K_{r1}$ and $K_{r2}$ are the number of rows and $K_{c1}$ and $K_{c2}$ are the number of columns in the rectangular information matrices $M_1$ and $M_2$ respectively converting the rectangular information matrices $M_1$ and $M_2$ to 2D product polar code encoded matrices $X_1$ and $X_2$ respectively using product polar codes, the 2D product polar code encoded matrices $X_1$ and $X_2$ have a size of $N_{r1} \times N_{c1}$ and $N_{r2} \times N_{c2}$ respectively, where $N_{r1}$ and $N_{r2}$ are number of rows and $N_{c1}$ and $N_{c1}$ are number of columns of the encoded matrices $X_1$ and $X_2$ respectively converting the 2D product polar code encoded matrices $X_1$ and $X_2$ to a stream of encoded bits $X'$ encoding the stream of encoded bits $X'$ to a stream of polar encoded bits $X''$ using the polar codes

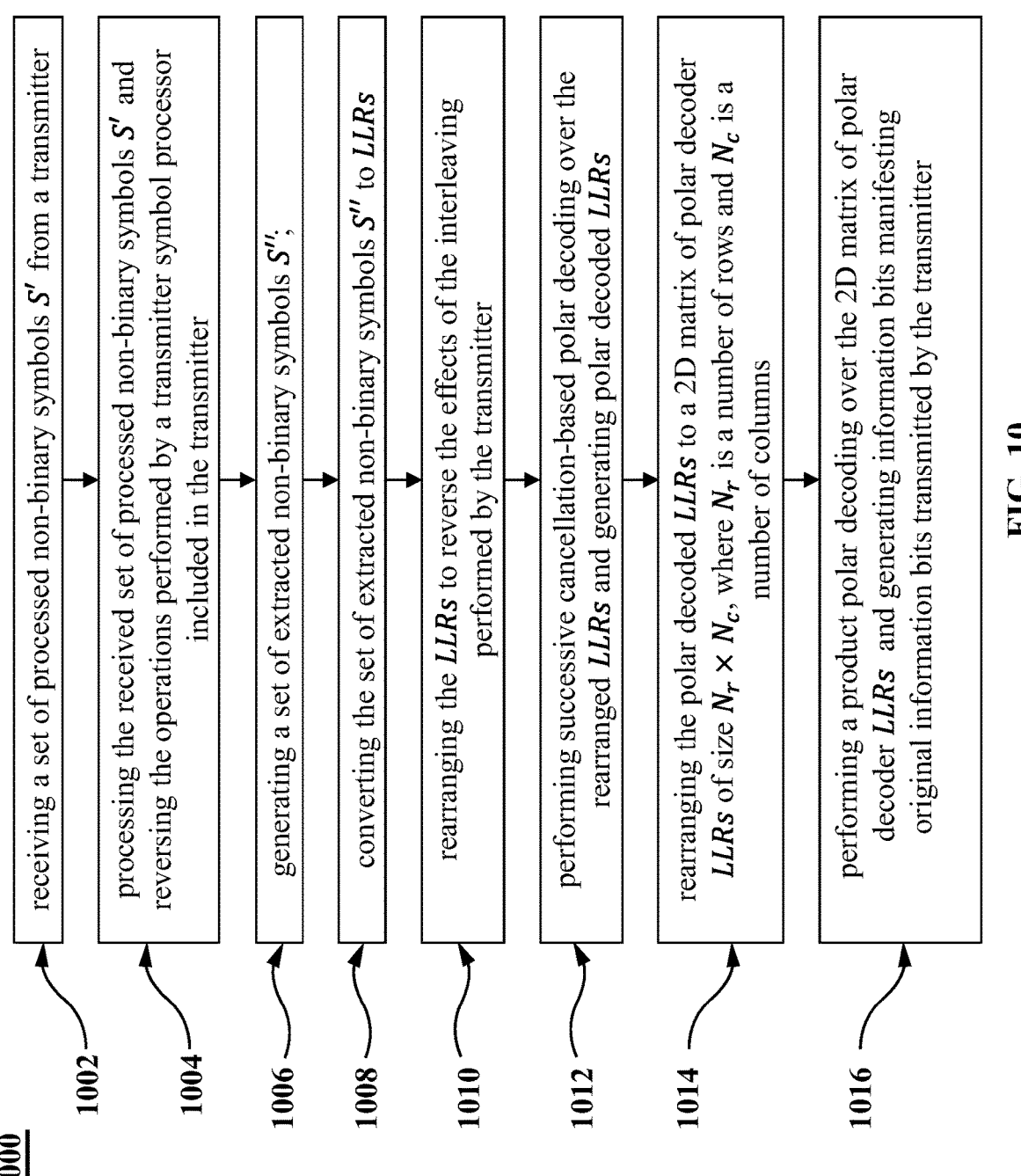

1000

1002 — receiving a set of processed non-binary symbols $S'$ from a transmitter

1004 — processing the received set of processed non-binary symbols $S'$ and reversing the operations performed by a transmitter symbol processor included in the transmitter 1006 — generating a set of extracted non-binary symbols $S''$;

1008 — converting the set of extracted non-binary symbols $S''$ to $LLRs$

1010 — rearranging the $LLRs$ to reverse the effects of the interleaving performed by the transmitter 1012 — performing successive cancellation-based polar decoding over the rearranged $LLRs$ and generating polar decoded $LLRs$ 1014 — rearranging the polar decoded $LLRs$ to a 2D matrix of polar decoder $LLRs$ of size $N_r \times N_c$, where $N_r$ is a number of rows and $N_c$ is a number of columns 1016 — performing a product polar decoding over the 2D matrix of polar decoder $LLRs$ and generating information bits manifesting original information bits transmitted by the transmitter

FIG. 10

HYBRID PRODUCT POLAR CODES-BASED COMMUNICATION SYSTEMS AND METHODS

CROSS-REFERENCE TO RELATED APPLICATIONS

This is the first application filed for the instantly disclosed technology.

TECHNICAL FIELD

The present disclosure generally relates to digital communications and, in particular, to hybrid product polar codes-based communication systems and methods.

BACKGROUND

Recently, fiber-optical communication systems have been deployed, from data center interconnections to cellular network backhauls and to transcontinental submarine systems. In modern high-throughput optical communication systems, forward error correction (FEC) is a crucial technique for protecting the data against the channel noise and inherent system impairments. However, FEC techniques are often power-hungry and may contribute to over a substantial amount (for example over 30%) of the total power consumed by the transceiver chips. Due to high-throughput applications, low-power consuming FEC techniques with parallel decoding capability are of significant interest for fiber-optical communication systems.

Typically, polar codes have been used to achieve the symmetric capacity of binary-input, discrete memoryless channels with low-complexity encoding and decoding. The polar codes have an explicit construction method with capacity-achieving properties that have been explored.

However, a primary concern regarding such polar codes is the high-decoding latency of the successive cancellation (SC) based decoding algorithms. In particular, the sequential nature of the SC decoder significantly reduces the achievable throughput. Lately, to improve the decoding latency, techniques have been proposed for fast SC decoding algorithms in which many of the computations have been parallelized. These techniques are mainly based on the identification of certain types of special nodes in the binary tree of the polar codes whose decoding can be performed in parallel rather than following the serial SC schedule.

Even with the fast SC decoding algorithms, conventional polar codes, in addition to the latency problem, suffer from low minimum distance and error propagation problems. As such, for long-length polar codes that are known to be capacity achieving, the latency of decoding even with fast decoders is high which makes them unattractive for low-latency applications.

With this said, there is an interest in improving the latency of a fiber-optical communication system.

SUMMARY

The embodiments of the present disclosure have been developed based on developers' appreciation of the limitations associated with the prior art, namely, a high-decoding latency of the successive cancellation (SC) based decoding algorithms of the polar codes. In particular, the sequential nature of the SC and successive cancellation list (SCL) decoders significantly reduces the achievable throughput. More particularly, for long-length polar codes that are known to be capacity achieving, the latency of decoding even with fast decoders is high which makes them unattractive for low-latency applications.

Developers of the present technology have devised hybrid product polar codes-based communication systems and methods. Various non-limiting embodiments of the present disclosure may be based on the hybrid product polar codes (HPPC). The product polar codes are parallel concatenated codes whose decoding process may be easily parallelized. The product polar codes have good error-correction performance, high minimum distance, low latency and high throughput. In product polar codes, the vertical and horizontal component codes may be chosen to be short-length polar codes that have low latency. While product polar codes may benefit from low latency and high-throughput decoding, due to the small-length of component codes, the error rate performance specially at low signal-to-noise (SNR) regions may be improved by using polar codes in addition to the product polar codes. In so doing, the fiber-optical communication systems may be improved in terms of latency and BER.

In accordance with a first broad aspect of the present disclosure, there is provided a communication system comprising: a transmitter including: a product polar code encoder configured to: receive a stream of information bits, reshape the stream of information bits into at least a first rectangular information matrix $M_1$ of size $K_{r1} \times K_{c1}$ and a second rectangular information matrix $M_2$ of size $K_{r2} \times K_{c2}$ where $K_{r1}$ and $K_{r2}$ are the number of rows and $K_{c1}$ and $K_{c2}$ are the number of columns in the rectangular information matrices $M_1$ and $M_2$ respectively, convert the rectangular information matrices $M_1$ and $M_2$ to 2D product polar code encoded matrices $X_1$ and $X_2$ respectively using product polar codes, the 2D product polar code encoded matrices $X_1$ and $X_2$ have a size of $N_{r1} \times N_{c1}$ and $N_{r2} \times N_{c2}$ respectively, where $N_{r1}$ and $N_{r2}$ are number of rows and $N_{c1}$ and $N_{c1}$ are number of columns of the encoded matrices $X_1$ and $X_2$ respectively, convert the 2D product polar code encoded matrices $X_1$ and $X_2$ to a stream of encoded bits X'; and a polar code encoder configured to encode the stream of encoded bits X' to a stream of polar encoded bits X" using the polar codes.

In accordance with any embodiments of the present disclosure, the communication system further comprises an interleaver configured to rearrange the stream of polar encoded bits X" to generate a stream of rearranged polar encoded bits X'''; a bits-to-symbol mapper configured to map the stream of rearranged polar encoded bits X''' to a set of non-binary symbols S; and a transmitter symbol processor configured to process the set of non-binary symbols S to generate a set of processed non-binary symbols S' and transmit the set of processed non-binary symbols S' towards a receiver.

In accordance with any embodiments of the present disclosure, the product polar codes have a code rate R less than a first threshold.

In accordance with any embodiments of the present disclosure, the product polar codes have a code rate R greater than a second threshold.

In accordance with a second broad aspect of the present disclosure, there is provided a communication system comprising: a receiver including: a receiver symbol processor configured to: receive a set of processed non-binary symbols S' from a transmitter, process the received set of processed non-binary symbols S' to reverse the operations performed by a transmitter symbol processor included in the transmitter, and generate a set of extracted non-binary symbols S"; a symbols-to-log-likelihood ratio (LLR) convertor configured to convert the set of extracted non-binary symbols S"
to LLRs; a deinterleaver configured to rearrange the LLRs to
reverse the effects of the interleaving performed by the
transmitter; a polar decoder configured to: perform succes-
sive cancellation-based polar decoding over the rearranged
LLRs and generate polar decoded LLRs, rearrange the polar
decoded LLRs to a 2D matrix of polar decoder LLRs of size
$N_r \times N_c$, where $N_r$ is a number of rows and $N_c$ is a number of
columns; and a product polar code decoder configured to
perform a product polar decoding over the 2D matrix of
polar decoder LLRs to generate information bits manifesting
original information bits transmitted by the transmitter.

In accordance with any embodiments of the present
disclosure, the product polar code decoder performs product
polar code decoding in an iterative manner.

In accordance with any embodiments of the present
disclosure, the product polar code decoder performs $N_r$-
parallel fast successive cancellation list-based decoding of
the rows of the 2D matrix of polar decoder LLRs.

In accordance with any embodiments of the present
disclosure, the product polar code decoder performs $N_c$-
parallel fast successive cancellation list-based decoding of
the columns of the 2D matrix of polar decoder LLRs.

In accordance with any embodiments of the present
disclosure, the product polar code decoder computes a priori
information $L_{apr}(i, j)$ and a posteriori information $L_{app}(i, j)$
from the 2D matrix of polar decoder LLRs, where i and j
represent ith row and jth column of the 2D matrix of polar
decoder LLRs.

In accordance with any embodiments of the present
disclosure, the product polar code computes the a posteriori
information $L_{app}(i, j)$ as:

$$L_{app}(i, j) = \begin{cases} (1 - 2C^*(j))\left(PML_{minC_j^{cc}} - PML_0\right) & \text{if } C_j^{cc} \text{ exists} \\ (1 - 2C^*(j))\eta & \text{Otherwise} \end{cases}$$

where $\eta$ is an iteration dependent scaling factor, $C^*(j)$ is a
candidate codeword, $PML_{minC_j^{cc}}$ is a minimum path metric
among competitor codewords for bit location j, $PML_0$ is a
minimum path metric associated with the most likely code-
word in a list of candidate codewords provided a SCL
algorithm, and $C_j^{cc}$ is a candidate codeword with a minimum
squared distance in the list of candidate codewords.

In accordance with any embodiments of the present
disclosure, the product polar code decoder computes the
information bits from the a priori information $L_{apr}(i, j)$ and
the a posteriori information $L_{app}(i, j)$ as follows:

$$L_{ex}(i, j) = L_{app}(i, j) - L_{apr}(i, j)$$

where $L_{ex}(i, j)$ is extrinsic information representing the
information bit at the ith row and jth column of the 2D
matrix of polar decoder LLRs.

In accordance with a third broad aspect of the present
disclosure, there is provided a communication method com-
prising: receiving a stream of information bits; reshaping the
stream of information bits into at least a first rectangular
information matrix $M_1$ of size $K_{r1} \times K_{c1}$ and a second rect-
angular information matrix $M_2$ of size $K_{r2} \times K_{c2}$ where $K_{r1}$
and $K_{r2}$ are the number of rows and $K_{c1}$ and $K_{c2}$ are the
number of columns in the rectangular information matrices
$M_1$ and $M_2$ respectively; converting the rectangular infor-
mation matrices $M_1$ and $M_2$ to 2D product polar code
encoded matrices $X_1$ and $X_2$ respectively using product polar
codes, the 2D product polar code encoded matrices $X_1$ and
$X_2$ have a size of $N_{r1} \times N_{c1}$ and $N_{r2} \times N_{c2}$ respectively, where $N_{r1}$ and $N_{r2}$ are number of rows and $N_{c1}$ and $N_{c1}$ are number
of columns of the encoded matrices $X_1$ and $X_2$ respectively;
converting the 2D product polar code encoded matrices $X_1$
and $X_2$ to a stream of encoded bits X'; and encoding the
stream of encoded bits X' to a stream of polar encoded bits
X" using the polar codes.

In accordance with any embodiments of the present
disclosure, the communication method further comprises
rearranging the stream of polar encoded bits X" to generate
a stream of rearranged polar encoded bits X'''; mapping the
stream of rearranged polar encoded bits X''' to a set of
non-binary symbols S; processing the set of non-binary
symbols S and generating a set of processed non-binary
symbols S'; transmitting the set of processed non-binary
symbols S' towards a receiver.

In accordance with any embodiments of the present
disclosure, the product polar codes have a code rate R less
than a first threshold.

In accordance with any embodiments of the present
disclosure, the product polar codes have a code rate R
greater than a second threshold.

In accordance with a fourth broad aspect of the present
disclosure, there is provided a communication method com-
prising: receiving a set of processed non-binary symbols S'
from a transmitter; processing the received set of processed
non-binary symbols S' and reversing the operations per-
formed by a transmitter symbol processor included in the
transmitter; generating a set of extracted non-binary symbols
S"; converting the set of extracted non-binary symbols S" to
LLRs; rearranging the LLRs to reverse the effects of the
interleaving performed by the transmitter; performing suc-
cessive cancellation-based polar decoding over the rear-
ranged LLRs and generating polar decoded LLRs; rearrang-
ing the polar decoded LLRs to a 2D matrix of polar decoder
LLRs of size $N_r \times N_c$, where $N_r$ is a number of rows and $N_c$
is a number of columns; and performing a product polar
decoding over the 2D matrix of polar decoder LLRs and
generating information bits manifesting original information
bits transmitted by the transmitter.

In accordance with any embodiments of the present
disclosure, the product polar code decoding is performed in
an iterative manner.

In accordance with any embodiments of the present
disclosure, the communication method further comprises
performing $N_r$-parallel fast successive cancellation list-
based decoding of the rows of the 2D matrix of polar
decoder LLRs.

In accordance with any embodiments of the present
disclosure, the communication method further comprises
performing $N_c$-parallel fast successive cancellation list-
based decoding of the columns of the 2D matrix of polar
decoder LLRs.

In accordance with any embodiments of the present
disclosure, the communication method further comprises
computing a priori information $L_{apr}(i, j)$ and a posteriori
information $L_{app}(i, j)$ from the 2D matrix of polar decoder
LLRs, where i and j represent ith row and jth column of the
2D matrix of polar decoder LLRs.

In accordance with any embodiments of the present
disclosure, the communication method further comprises
computing the a posteriori information $L_{app}(i, j)$ as:

$$L_{app}(i, j) = \begin{cases} (1 - 2C^*(j))\left(PML_{minC_j^{cc}} - PML_0\right) & \text{if } C_j^{cc} \text{ exists} \\ (1 - 2C^*(j))\eta & \text{Otherwise} \end{cases}$$

5 where $\eta$ is an iteration dependent scaling factor, $C^*(j)$ is a candidate codeword, $PML_{minC_j^{cc}}$ is a minimum path metric among competitor codewords for bit location j, $PML_0$ is a minimum path metric associated with the most likely codeword in a list of candidate codewords provided a SCL algorithm, and $C_j^{cc}$ is a candidate codeword with a minimum squared distance in the list of candidate codewords.

In accordance with any embodiments of the present disclosure, the communication method further comprises computing the information bits from the a priori information $L_{apr}(i, j)$ and the a posteriori information $L_{app}(i, j)$ as follows:

$$L_{ex}(i, j) = L_{app}(i, j) - L_{apr}(i, j)$$

where $L_{ex}(i, j)$ is extrinsic information representing the information bit at the ith row and jth column of the 2D matrix of polar decoder LLRs.

BRIEF DESCRIPTION OF THE FIGURES

Further features and advantages of the present disclosure will become apparent from the following detailed description, taken in combination with the appended drawings, in which:

FIG. 9 illustrates a flowchart of a process for hybrid product polar codes-based communication method, in accordance with various non-limiting embodiments of the present disclosure; and FIG. 10 illustrates a flowchart of a process for hybrid product polar codes-based communication method, in accordance with various non-limiting embodiments of the present disclosure It is to be understood that throughout the appended drawings and corresponding descriptions, like features are identified by like reference characters. Furthermore, it is also to be understood that the drawings and ensuing descriptions are intended for illustrative purposes only and that such disclosures do not provide a limitation on the scope of the claims.

DETAILED DESCRIPTION

Figure 1:
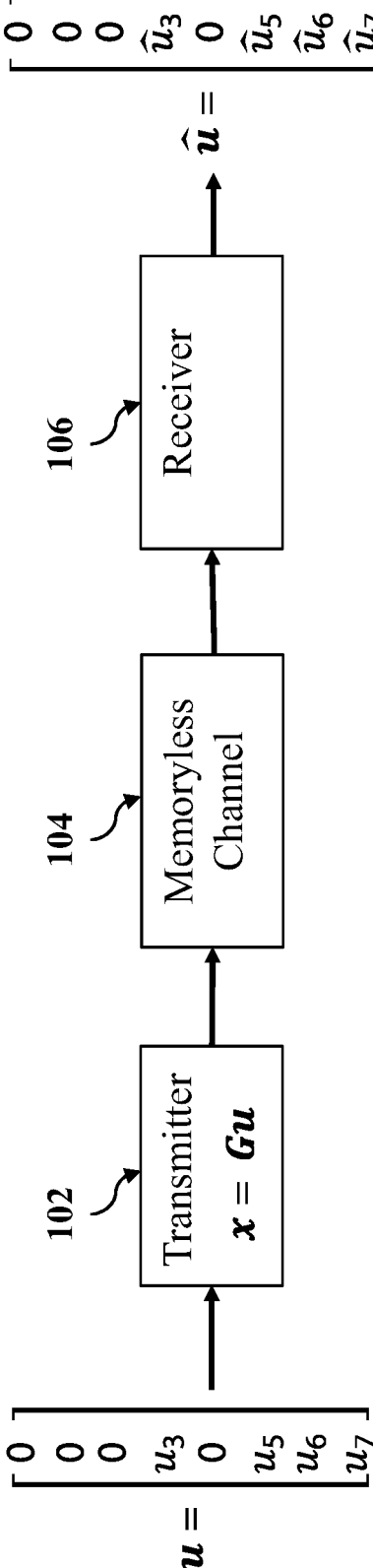
FIG. 1 (Prior Art) illustrates a communication system for encoding and decoding of a polar code with a length of N=8 and a length of information bits K=4.

The instant disclosure is directed to address at least some of the deficiencies of the current technology. In particular, the instant disclosure describes hybrid product polar codes-based communication systems and methods.

Unless otherwise defined or indicated by context, all technical and scientific terms used herein have the same meaning as commonly understood by one of ordinary skill in the art to which the described embodiments appertain to.

In the context of the present specification, unless provided expressly otherwise, the words "first", "second", "third", etc. have been used as adjectives only for the purpose of allowing for distinction between the nouns that they modify from one another, and not for the purpose of describing any particular relationship between those nouns. Thus, for example, it should be understood that, the use of the terms "first processor" and "third processor" is not intended to imply any particular order, type, chronology, hierarchy or ranking (for example) of/between the processor, nor is their use (by itself) intended to imply that any "second processor" must necessarily exist in any given situation. Further, as is discussed herein in other contexts, reference to a "first" element and a "second" element does not preclude the two elements from being the same actual real-world element. Thus, for example, in some instances, a "first" processor and a "second" processor may be the same software and/or hardware, in other cases they may be different software and/or hardware.

It will be understood that when an element is referred to as being "connected" or "coupled" to another element, it can be directly or indirectly connected or coupled to the other element or intervening elements that may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In the context of the present specification, when an element is referred to as being "associated with" another element, in certain embodiments, the two elements can be directly or indirectly linked, related, connected, coupled, the second element employs the first element, or the like without limiting the scope of present disclosure.

The terminology used herein is only intended to describe particular representative embodiments and is not intended to be limiting of the present technology. As used herein, the singular forms "a," "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Implementations of the present technology each have at least one of the above-mentioned objects and/or aspects, but do not necessarily have all of them. It should be understood that some aspects of the present technology that have resulted from attempting to attain the above-mentioned object may not satisfy this object and/or may satisfy other objects not specifically recited herein.

The examples and conditional language recited herein are principally intended to aid the reader in understanding the principles of the present technology and not to limit its scope to such specifically recited examples and conditions. It will be appreciated that those skilled in the art may devise various arrangements which, although not explicitly described or shown herein, nonetheless embody the principles of the present technology and are included within its spirit and scope.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative circuitry embodying the principles of the present technology. Similarly, it will be appreciated that any flowcharts, flow diagrams, state transition diagrams, pseudocode, and the like represent various processes which may be substantially represented in computer-readable media and so executed by a computer or processor, whether or not such computer or processor is explicitly shown.

The functions of the various elements shown in the figures, including any functional block labeled as a "processor" or a "processing unit", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. In some embodiments of the present technology, the processor may be a general-purpose processor, such as a central processing unit (CPU) or a processor dedicated to a specific purpose, such as a graphics processing unit (GPU). Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read-only memory (ROM) for storing software, random access memory (RAM), and non-volatile storage. Other hardware, conventional and/or custom, may also be included.

In the context of the present disclosure, the expression "data" includes data of any nature or kind whatsoever capable of being stored in a database. Thus, data includes, but is not limited to, audiovisual works (images, movies, sound records, presentations etc.), data (location data, numerical data, etc.), text (opinions, comments, questions, messages, etc.), documents, spreadsheets, etc.

Software modules, modules, or units which are implied to be software, may be represented herein as any combination of flowchart elements or other elements indicating performance of process steps and/or textual description. Such modules may be executed by hardware that is expressly or implicitly shown.

With these fundamentals in place, the instant disclosure is directed to address at least some of the deficiencies of the current technology. In particular, the instant disclosure describes hybrid product polar codes-based communication systems and methods.

FIG. 1 (Prior Art) illustrates a system communication 100 for encoding and decoding of a polar code with a length of N=8 and a length of information channel K=4. As shown, the communication system 100 includes a transmitter 102, and a receiver 106. The transmitter 102 may include a binary polar encoder. The encoder uses a binary polar code $P(N, K)$ of length $N=2^n$ and length of information channel K maps an input vector $u=\{u_0, u_1, \ldots, u_{N-1}\}$ to the output vector $x=\{x_0, x_1, \ldots, x_{N-1}\}$ such that $$x=uG_N \tag{1}$$

The matrix $G_N=B_N F_2^{\otimes n}$ is a generator matrix where $B_N$ is a bit-reversal permutation matrix and $F_2^{\otimes n}$ is the nth Tensor power of $F_2$ defined as $$F_2^{\otimes n} = \begin{bmatrix} F_2^{\otimes n-1} & 0 \\ F_2^{\otimes n-1} & F_2^{\otimes n-1} \end{bmatrix} \tag{2}$$

The symbol 0 is used to denote an all zero sub-matrix and $F_2$ is defined as $$F_2 = \begin{bmatrix} 1 & 0 \\ 1 & 1 \end{bmatrix} \tag{3}$$

The matrix $F_2^{\otimes n}$ synthesizes N polarized channels from N independent copies of a given channel. Amongst different polarized channels, the K most reliable channels are used to carry the information. In other words, the input vector $u=\{u_0, u_1, \ldots, u_{N-1}\}$ consists of K information bits and N−K fixed bits referred to as frozen bits that are known to the receiver. The index set of the K information bits corresponding to the most reliable bit channels and N−K frozen bits corresponding to the least reliable bit channels are denoted by $\mathbb{A}$ and $\mathbb{A}^c$, respectively. To distinguish between the frozen bits and information bits, a binary vector $d=(d_0, d_1, \ldots, d_{N-1})$ is defined such that:

$$d_k = \begin{cases} 0, k \in \mathbb{A}^c \\ 1, k \in \mathbb{A} \end{cases} \tag{4}$$

The reliability order of different polarized channels can be obtained based on various techniques such as density evolution (DE), Tal and Vardy method, Gaussian approximation (GA) etc.

The transmitter 102 transmits the output vector $x=\{x_0, x_1, \ldots, x_{N-1}\}$ over communication channel 104. The output vector $x=\{x_0, x_1, \ldots, x_{N-1}\}$ may be affected by noise. The receiver 106 receives the noisy codewords from the communication channel 104, the receiver 106 computes and provide log likelihood ratio (LLR) vector $y=\{y_0, y_1, \ldots, y_{N-1}\}$, of the received codewords to a polar-code decoder. The decoder, then, estimates the input and output vector of encoder, denoted by $\hat{u}$ and $\hat{x}$, respectively.

Figure 2:
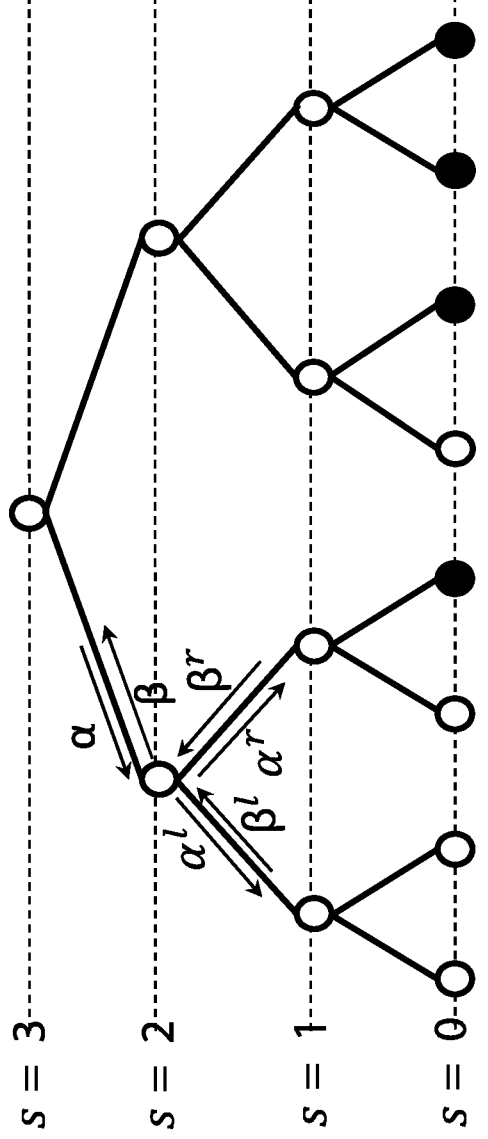
FIG. 2 (Prior Art) illustrates a binary-tree representation of the polar code P(8, 4)

Relatedly, FIG. 2 (Prior Art) illustrates a binary-tree representation 200 of the polar code $P(8, 4)$. Typically, the polar-code decoder relies on successive cancelation (SC) decoding. The SC decoding may basically be viewed as the exchange of information between the nodes in the binary tree 200. In particular, each node receives a soft information vector denoted by a with $2^s$ elements. The vector a of the root node at the top of the tree 200 is the channel LLR vector, i.e., $y=\{y_0, y_1, \ldots, y_{N-1}\}$, while a for other nodes is received from their parent nodes. With exception of the leaf nodes at the bottom of the tree 200, using the soft information vector $\alpha$, each node computes the information toward its left child as:

$$\alpha_i^l = \text{sign}(\alpha_{2i})\text{sign}(\alpha_{2i+1})\min(|\alpha_{2i}|,|\alpha_{2i+1}|) \quad (5)$$

Where $\alpha_i^l$ is the ith ($0 \leq i \leq 2^{s-1}-1$) elements of the information vector $\alpha^l$ toward the left child node. The information toward the right child node cannot be calculated unless a node receives the binary vector $\beta^l$ with entries $\beta_i^l$ from its left child node. The information toward the right-child node is given by:

$$\alpha_i^r = \alpha_{2i+1} + (1-2\beta_i^l)\alpha_{2i} \quad (6)$$

Where $\alpha_i^r$ denotes the ith ($0 \leq i \leq 2^{s-1}-1$) elements of the information vector toward the right child node. Finally, after receiving the binary vector $\beta^r$ from the right-child node, the binary vector $\beta$ with size $2^s$ is sent toward the parent node. This vector is computed as:

$$\beta = \{\beta^l \oplus \beta^r \beta^r\} \quad (7)$$

In the above equation, $\beta^l \oplus \beta^r$ represents an elementwise modulo-2 addition of the vectors $\beta^l$ and $\beta^r$.

At each leaf node k, a hard decision is made on the received soft LLR from the parent node to calculate $\hat{u_k}$. Also, the binary vector $\beta$ calculated at the root node is the same as the estimated codeword $\hat{x}$.

The error-correction performance of SC when applied to polar codes with short to moderate length can be improved by the use of list-based decoding. Successive cancellation list (SCL) algorithm estimates a bit considering both its possible values 0 and 1. At every estimation, the number of codeword candidates (paths) doubles. In order to limit the increase in the complexity of this algorithm, only a set of L codeword candidates is memorized at all times. Thus, after every estimation, half of the paths are discarded. To this purpose, a path metric (PM) is associated to each path and updated at every new estimation. The PM can be considered a cost function, and the L paths with the lowest PMs are allowed to survive. In the LLR-based SCL, the path metric can be obtained as $$PML_{i_l} = \begin{cases} PML_{i_l} + |\alpha_{i_l}| & \text{if } \hat{u}_{i_l} \neq \frac{1}{2}(1 - \text{sgn}(\alpha_{i_l})) \\ PML_{i-1_l} & \text{Otherwise} \end{cases} \quad (8)$$

Where the initial path metric is $PML_{-1_l}=0$. The symbol l is the path index and $\hat{u}_{i_l}$ is the estimate of bit i at path l. The above metric basically means whenever a decision is against the sign of a bit LLR, the corresponding path is penalized by the absolute value of that LLR and otherwise, the penalty would be zero.

A primary concern regarding the polar codes is the high-decoding latency of the SC based decoding algorithms. In particular, the sequential nature of the SC and SCL decoders significantly reduces the achievable throughput. More particularly, for long-length polar codes that are known to be capacity achieving, the latency of decoding even with fast decoders is high which makes them unattractive for low-latency applications.

Various non-limiting embodiments of the present disclosure may be based on the hybrid product polar codes (HPPC). The product polar codes are parallel concatenated codes whose decoding process may be easily parallelized. The product polar codes have good error-correction performance, high minimum distance, low latency and high throughput. In product polar codes, the vertical and horizontal component codes may be chosen to be short-length polar codes that have low latency. While product polar codes may benefit from low latency and high-throughput decoding, due to the small-length of component codes, the error rate performance specially at low signal-to-noise (SNR) regions may be improved by using polar codes in addition to the product polar codes. In so doing, the fiber-optical communication systems may be improved in terms of latency and BER.

Figure 3:
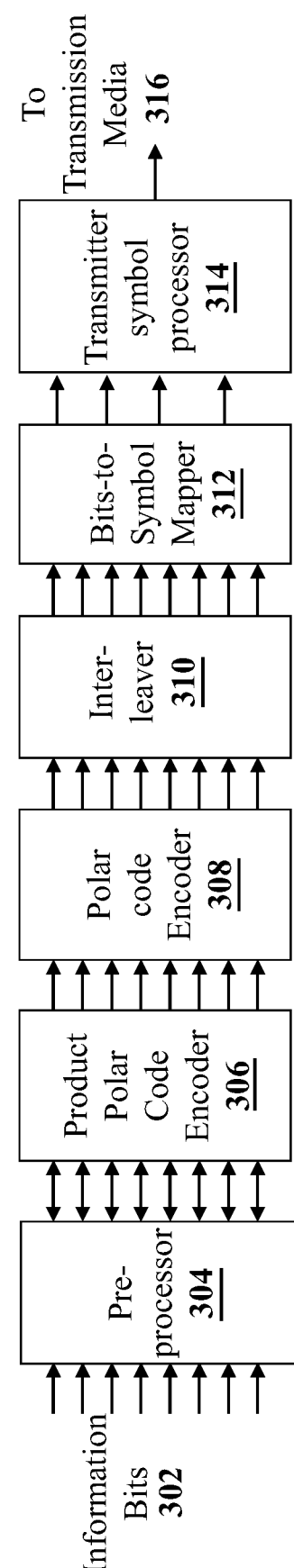
FIG. 3 illustrates a high-level functional block diagram of a transmitter included in a communication system, in accordance with various non-limiting embodiments of the present disclosure.

To this end, FIG. 3 illustrates a high-level functional block diagram of a transmitter 300 incorporated into communication system 100, in accordance with various non-limiting embodiments of the present disclosure. As shown in FIG. 3, the transmitter 300 may include a pre-processor 304, a product polar code encoder 306, a polar code encoder 308, an interleaver 310 a bits-to symbol mapper 312 and a transmitter symbol processor 314. It is to be noted that the transmitter 300 may include other modules and components such as processors and controllers. However, for the purposes of simplicity, such modules and components have been omitted from FIG. 3.

The pre-processor 304 may be configured to receive a stream of information bits 302 and the pre-processor 304 may reshape the information bits 302 into at least two rectangular information matrices $M_1$ and $M_2$ of size $K_{r1} \times K_{c1}$ and $K_{r2} \times K_{c2}$ respectively, where $K_{r1}$ may be the number of rows and $K_{c1}$ may be the number of columns in the rectangular information matrix $M_1$ and $K_{r2}$ may be the number of rows and $K_{c2}$ may be the number of columns in the rectangular information matrix $M_2$. The pre-processor 304 may convert the rectangular information matrix $M_1$ into a rectangular matrix $U_{c1}$ of size $K_{r1} \times N_{c1}$, where $K_{r1}$ may be the number of rows and $N_{c1}$ may be the number of columns in the rectangular matrix $U_{c1}$. Also, the value of $N_{c1}$ may be greater than $K_{c1}$. In a similar manner, the pre-processor 304 may convert the rectangular information matrix $M_2$ into a rectangular matrix $U_{c2}$ of size $K_{r2} \times N_{c2}$, where $K_{r2}$ may be the number of rows and $N_{c2}$ may be the number of columns in the rectangular matrix $U_{c2}$. Also, the value of 2 may be greater than $K_{c2}$.

The rectangular matrices $U_{c1}$ and $U_{c2}$, may include a plurality of bit channels. Some of the bit channels may be information bit channels and other bit channels may be frozen bit channels. In certain non-limiting embodiments, the frozen bit channels may be referred to as those channels over which transmission of information bits is least preferred and information bit channels may be referred to a preferable channel over which the information bits may be transmitted. It is to be noted that how a given bit channel is selected as the information bit channel or frozen bit channel should not limit the scope of present disclosure.

In order to convert the rectangular information matrices $M_1$ and $M_2$ into the rectangular matrices $U_{c1}$ and $U_{c2}$ respectively, the pre-processor 304 may place the information bits in the columns of the rectangular information matrices $M_1$ and $M_2$ on information bit channels in the rows of the rectangular matrices $U_{c1}$ and $U_{c2}$ respectively. The pre-processor 304 may forward the rectangular matrices $U_{c1}$ and $U_{c2}$ to the product polar code encoder 306. The product polar code encoder 306 may encode the rows of the rectangular matrices $U_{c1}$ and $U_{c2}$ by using the column components of the product polar codes. The encoded matrices may be represented as column encoded matrices $X_{c1}$ and $X_{c2}$.

It is to be noted that a rate of components codes in the product polar codes may be very low or very high. The binary trees of low-rate and/or high-rate product polar codes may be significantly simplified leading to low decoding latency. In certain non-limiting embodiments, the product polar codes may have a code rate R less than a first threshold, for example, the code rate R of the product polar codes may be smaller than 0.4. In other non-limiting embodiments, the product polar codes may have the code rate R greater than the second threshold, for example, the code rate R of the product polar codes may be greater than 0.6.

The product polar code encoder 306 may provide the column encoded matrices $X_{c1}$ and $X_{c2}$ to the pre-processor 304. The pre-processor 304 may convert the column encoded matrices $X_{c1}$ and $X_{c2}$ having sizes of $K_{r1} \times N_{c1}$ and $K_{r2} \times N_{c2}$ respectively to rectangular matrices $U_{r1}$ and $U_{r2}$ of size $N_{r1} \times N_{c1}$ and $N_{r2} \times N_{c2}$ respectively, where $N_{r1}$ may be the number of rows in the rectangular matrix $U_{r1}$ and $N_{r2}$ may be the number of rows in the rectangular matrix $U_{r2}$. Also, the value of $N_{r1}$ may be greater than $K_{r1}$ and the value of $N_{r2}$ may be greater than $K_{r2}$. The rectangular matrices $U_{r1}$ and $U_{r2}$, may include some more frozen bit channels as compared to the frozen bit channels in the rectangular matrices $U_{c1}$ and $U_{c2}$. The pre-processor 304 may place the information bits in the rows of the column encoded matrices $X_{c1}$ and $X_{c2}$ on information bit channels in the column of the rectangular matrices $U_{r1}$ and $U_{r2}$. The pre-processor 304 may forward the rectangular matrices $U_{r1}$ and $U_{r2}$ to the product polar code encoder 306. The product polar code encoder 306 may encode the columns of the rectangular matrices $U_{r1}$ and $U_{r2}$ by using the row components of the product polar codes. The encoded matrices may be represented as 2D product polar code encoded matrices $X_1$ and $X_2$.

It will be appreciated that, although the pre-processor 304 and the product polar code encoder 306 have been illustrated as different components, in certain non-limiting embodiments, the pre-processor 304 and the product polar code encoder 306 may be implemented as a single module. In other words, the pre-processor 304 may be included in the product polar code encoder 306 without limiting the scope of present disclosure.

In certain non-limiting embodiments, the product polar code encoder 306 may convert the 2D product polar code encoded matrices $X_1$ and $X_2$ to a stream of encoded bits X'. The product polar code encoder 306 may provide the stream of encoded bits X' to the polar code encoder 308. The polar code encoder 308 may be configured to encode the stream of encoded bits X' using the polar codes.

In certain non-limiting embodiments, the output of the polar code encoder 308 may be represented as follows:

$$C(P) = X' \cdot G \tag{1}$$

The G is a generator matrix of 2×2 polarization kernel and may be represented as:

$$G = \begin{bmatrix} 1 & 0 \\ 1 & 1 \end{bmatrix} \tag{2}$$

While performing the polar encoding, the generator matrix G may polarize the bits in a manner that the bit capacity of at least some of the bit channels associated with the polar code encoder 308 goes to 1 and remaining channels may have a zero capacity. Based on the required rate R, the information bits may be transmitted over the bit channels with high capacity (e.g., 1) and no information may be transmitted over the bit channels with low capacity (e.g., 0). The output of the polar code encoder 308 may be represented as a stream of polar encoded bits X".

Figure 4:
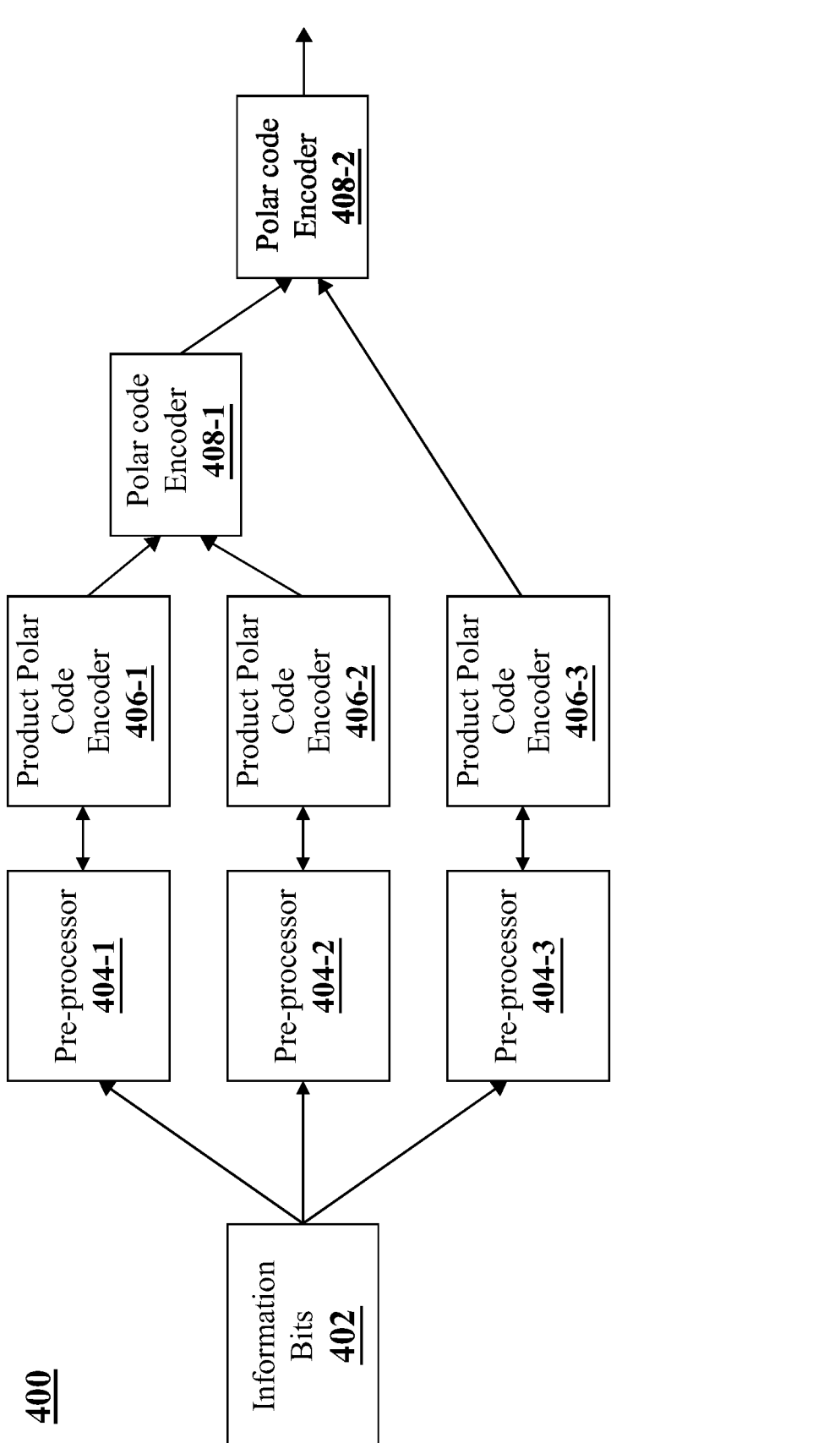
FIG. 4 illustrates a high-level functional block diagram of a parallel hybrid product polar codes (HPPC) encoder system included in the communication system, in accordance with various non-limiting embodiments of the present disclosure.

In FIG. 3, a serial operation encoding the information bits 302 has been illustrated. In various non-limiting embodiments, the product polar code encoding of the information bits 302 may be parallelized, where the product polar code encoding may be performed in parallel. As such, FIG. 4 illustrates a parallel HPPC encoder system 400, in accordance with various non-limiting embodiments of the present disclosure. As shown, the parallel HPPC encoder system 400 may include a plurality of pre-processors 404-1, 404-2, and 404-3, a plurality of product polar code encoders 406-1, 406-2, and 406-3, and a plurality of polar code encoders 408-1 and 408-2. It is to be noted that the parallel HPPC encoder system 400 may include other components, however, such components have been omitted from FIG. 4 for the purpose of simplicity.

Each one of the plurality of pre-processors 404-1, 404-2, and 404-3 may be configured to receive a portion of the information bits 402. By way of example, the pre-processor 404-1 may convert the received portion of the information bits 402 to a rectangular information matrix $M_1$ of size $K_{r1} \times K_{c1}$, the pre-processor 404-2 may convert the received portion of the information bits 402 to a rectangular information matrix $M_2$ of size $K_{r2} \times K_{c2}$, and the pre-processor 404-3 may convert the received portion of the information bits 402 to a rectangular information matrix $M_2$ of size $K_{r3} \times K_{c3}$. The product polar code encoder 406-1 together with the pre-processor 404-1 may be configured to convert the rectangular information matrix $M_1$ to a 2D product polar code encoded matrix $X_1$ and then to a stream of encoded bits $X'_1$. In a similar manner, the product polar code encoder 406-2 together with the pre-processor 404-2 may be configured to convert the rectangular information matrix $M_2$ to a 2D product polar code encoded matrix $X_2$ and then to a stream of encoded bits $X'_2$. Also, the product polar code encoder 406-3 together with the pre-processor 404-3 may be configured to convert the rectangular information matrix $M_3$ to a 2D product polar code encoded matrix $X_3$ and then to a stream of encoded bits $X'_3$.

The product polar code encoder 406-1 and the polar code encoder 406-2 may forward the stream of encoded bits $X'_1$ and the stream of encoded bits $X'_2$ to the polar code encoder 408-1. The product polar code encoder 406-3 may forward the stream of encoded $X'_3$ to the polar code encoder 408-2.

The polar code encoder 408-1 may perform polar code-based encoding of the stream of encoded bits $X'_1$ and the stream of encoded bits $X'_2$ and may generate a stream of polar encoded bits $X"_1$. The polar code encoder 408-1 may forward the stream of polar encoded bits $X"_1$ to the polar code encoder 408-2. The polar code encoder 408-2 may perform polar code-based encoding of the stream of polar encoded bits $X"_1$ and the stream of encoded $X'_3$ and may generate a stream of polar encoded bits $X"_1$. Thus, by virtue of the parallel HPPC encoder system 400 the product polar code encoding of the information bits 402 may be further parallelized.

Returning to FIG. 3, optionally the polar code encoder 308 may forward the stream of polar encoded bits X" to the interleaver 310. The interleaver 310 may rearrange the stream of polar encoded bits X" to generate a stream of rearranged polar encoded bits X'''. The interleaver 310 may shuffle the stream of polar encoded bits X" in a predefined manner. By way of example, if there are 16 encoded information bits, rearranged encoded polar encoded bits X''' may have a sequence $X'''=X_1, X_9, X_2, X_{10} \ldots X_8, X_{16}$. It is to be noted that how the interleaver 310 rearranges the polar encoded bits X" should not limit the scope of present disclosure.

Optionally, the interleaver 310 may forward the rearranged encoded polar encoded bits X''' to the bits-to-symbol mapper 312. The bits-to-symbol mapper 312 may map the rearranged encoded polar encoded bits X''' to a set of non-binary symbols S in accordance with a suitable pulse amplitude modulation technique. In one non-limiting embodiment, the bits-to-symbol mapper 312 may rely on 4-PAM technique. By way of example, the polar encoded information bits $X_1$ and $X_9$ may be mapped to non-binary symbol $S_1$, the polar encoded information bits $X_2$ and $X_{10}$ may be mapped to non-binary symbol $S_2$ and so on. Since the mapping technique may be 4-PAM, the different symbols may be $-3, -1, +1$, and $+3$. The corresponding bit representation may be 00 for symbol $-3$, 01 for symbol $-1$, 10 for symbol $+1$, and 11 for symbol $+3$.

Alternatively, the bits-to-symbol mapper 312 may forward the set of non-binary symbols S to the transmitter symbol processor 314 for processing and transmitting. The transmitter symbol processor 314 may be process the non-binary symbols S to generate a set of processed non-binary symbols S'. In certain non-limiting embodiments, the processing of the processed non-binary symbols S may involve various operations such as the modulation of symbols to high frequency carriers or any such operation that prepares the non-binary symbols S for transmission to a transmission medium 316. It is to be noted that the transmission medium 316 may be a wireless medium, wired medium or optical medium without limiting the scope of present disclosure. Depending upon the transmission medium 316, the transmitter symbol processor 314 may process the non-binary symbols S. Further, in certain non-limiting embodiments, prior to the modulation, the transmitter symbol processor 314 may perform up-sampling operation on the non-binary symbols S. The transmitter symbol processor 314 may transmit the processed non-binary symbols S' to the transmission media 316.

Figure 5:
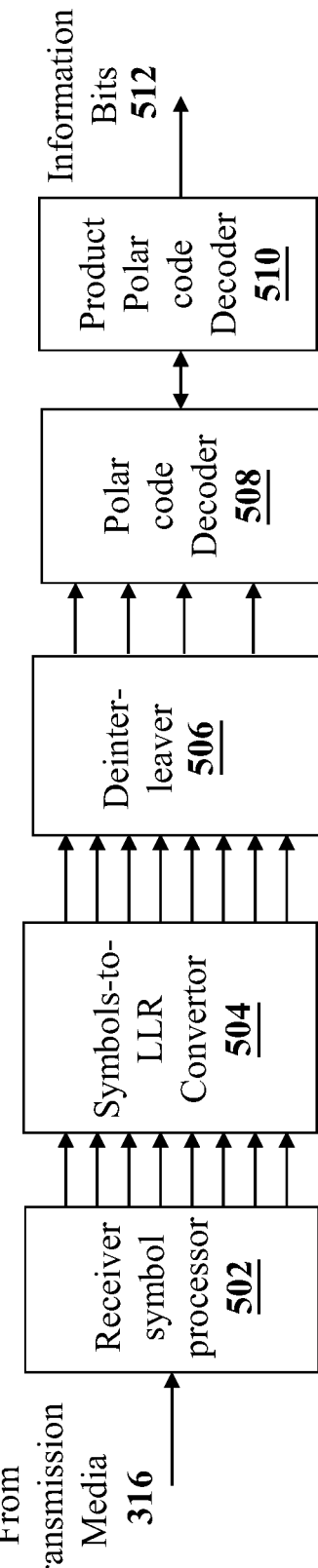
FIG. 5 illustrates a high-level functional block diagram of a receiver included in a communication system, in accordance with various non-limiting embodiments of the present disclosure.

The communication system 100 may further include a receiver 500, as depicted by FIG. 5, in accordance with various non-limiting embodiments of the present disclosure. As shown, the receiver 500 may include a receiver symbol processor 502, a symbols-to-LLR convertor 504, a deinterleaver 506, and a polar decoder 508, and a product polar code decoder 510. It is to be noted that the receiver 500 may include other modules and components such as processors and controllers. However, for the purposes of simplicity, such modules and components have been omitted from FIG. 5.

The receiver 500 may receive the processed non-binary symbols S' from the transmission media 316. The receiver symbol processor 502 may process the received processed non-binary symbols S' to reverse the operations performed by the transmitter symbol processor 314. By way of example, the receiver symbol processor 502 may perform operations like down sampling, demodulation, etc. The receiver symbol processor 502 generate a set of extracted non-binary symbols S".

The receiver symbol processor 502 may forward the extracted non-binary symbols S" to the symbols-to-LLR convertor 504. The symbols-to-LLR convertor 504 may convert the extracted non-binary symbols S" to a set of LLRs. It is to be noted that LLRs may correspond to the information bits 302.

The symbols-to-LLR convertor 504 may forward the LLRs to the deinterleaver 506. The deinterleaver 506 may rearrange the LLRs to reverse the effects of the interleaving performed by the interleaver 310.

The deinterleaver 122 may forward the M rearranged LLRs to the polar decoder 508. The polar decoder 508 may perform SC-based polar decoding over the rearranged LLRs and may generate polar decoded LLRs. In addition to the polar decoding, the polar decoder 508 may be configured to rearrange the polar decoded LLRs to a 2D matrix. The polar code decoder 508 may provide the 2D matrix of polar decoder LLRs to the product polar code decoder 510. The product polar code decoder 510 may perform product polar decoding in an iterative manner in conjunction with the polar decoder 508.

Figure 6:
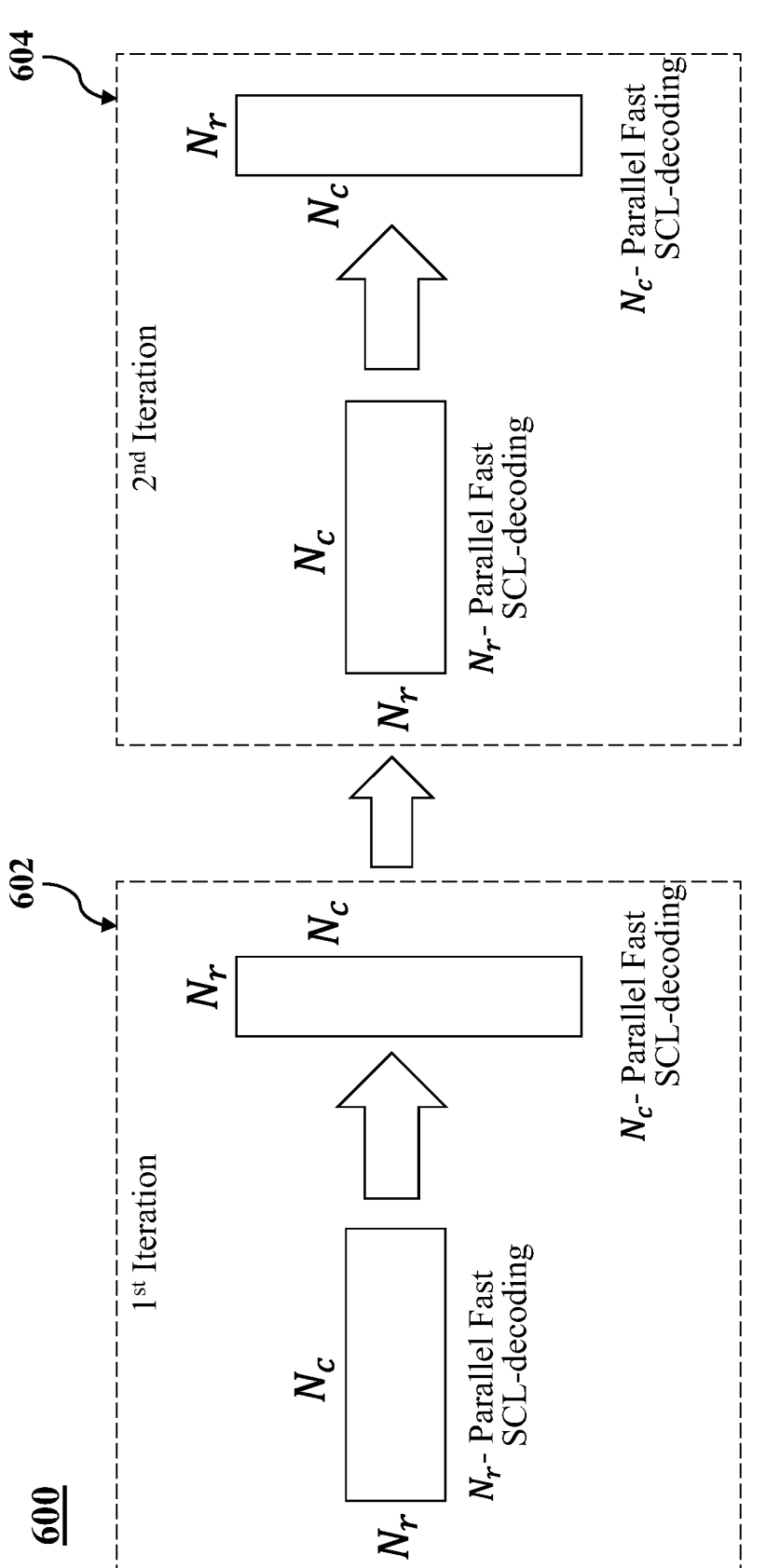
FIG. 6 illustrates a product polar code decoding process performed by the product polar code decoder, in accordance with various non-limiting embodiments.

FIG. 6 illustrates a product polar code decoding process 600 performed by the product polar code decoder 508, in accordance with various non-limiting embodiments. As shown, $N_r$, $N_c$ may represent number of rows and columns of the 2D matrix of polar decoder LLRs respectively. Let $(i, j), \forall i=1, \ldots, N_r, j=1, \ldots, N_c$, represent the elements at the ith row and jth column of the 2D matrix of polar decoder LLRs and $L_{in}(i, j)$ may be the LLR of $(i, j)$ bit received from the parent node of the product code in the binary tree. In the iterative decoding of polar product code, the product polar code decoder 510 may perform $N_r$-parallel fast SCL decoding of the rows of the 2D matrix of polar decoder LLRs using $L_{apr}(i, j)$ as the a priori information. In order to perform iterative decoding over columns and rows, soft decision output (extrinsic information) may be propagated between column and row decoding. In other words, the product polar code decoder 510 may determine a posteriori information $L_{app}(i, j)$ and use the a posteriori information $L_{app}(i, j)$ to calculate the extrinsic information representing the information bits 512 as:

$$L_{ex}(i, j)=L_{app}(i, j)-L_{apr}(i, j) \qquad (3)$$

In certain non-limiting embodiments, the product polar code decoder 510, may use the a priori information $L_{apr}(i, j)$ as input of the $N_c$-parallel fast SCL decoding of the columns of the 2D matrix of polar decoder LLRs. The product polar code decoder 510 may update the a priori information $L_{apr}(i, j)$ using the above extrinsic information, the product polar code decoder 510 may update the a priori information $L_{apr}(i, j)$ as:

$$L_{apr}(i, j)=L_{in}(i, j)+\gamma L_{ex}(i, j) \qquad (4)$$

Also, the product polar code decoder 510 may compute the a posteriori information $L_{app}(i, j)$ in accordance with a simplified approach as:

$$L_{app}(i, j) = \begin{cases} (1 - 2C^*(j))\left(PML_{minC_j^{cc}} - PML_0\right) & \text{if } C_j^{cc} \text{ exists} \\ (1 - 2C^*(j))\eta & \text{Otherwise} \end{cases} \qquad (5)$$

Where $\gamma$ and $\eta$ are iteration dependent scaling factors that, for each iteration, may be updated through simulations. For each bit location j, the set $S_j^{cc}$ may consist of the candidate codewords in the list whose jth bit is different than the jth bit of the minimum-distance codeword may be represented as candidate codeword C*(j). The codeword with minimum squared distance in $S_j^{cc}$ may be denoted by C* be the candidate codeword $C_j^{cc}$. $PML_0$ may be the minimum path metric belonging to the most likely codeword given by SCL algorithm, $PML_{minC_j^{cc}}$ may be the minimum path metric among competitor codewords for bit location j.

It is to be noted that in the simplified approach represented in equation (5), the path metrics given by SCL decoders included in the product polar code decoder 510 may be used to calculate the a posteriori information without any need for computing the squared distance between the lth candidate codeword and the input a priori vector $L_{apr}(i, j)$ as required by the conventional techniques. The simplified approach may result in lower complexity.

After performing $N_c$-parallel fast SCL decoding for columns of the 2D matrix of polar decoder LLRs, one full-iteration 602 may be completed. Based on above equations, in certain non-limiting embodiments, after the first iteration 602, the product polar code decoder 510 may update the a priori information $L_{apr}(i, j)$ for the next round of iteration 604 and $N_r$-parallel fast SCL decoding of rows. In some of the non-limiting embodiments, a maximum number of iterations $I_{max}$ may be predefined in the product polar code decoder 510. In other non-limiting embodiments, the product polar code decoder 510 may be incorporated with an early termination criterion. In case the estimated codewords of horizontal and vertical decoding in an iteration be the same, the product polar code decoder 510 may terminate the decoding operation.

The product polar code decoder 510 may generate information bits 512 manifesting the original information bits 302.

Figure 7:
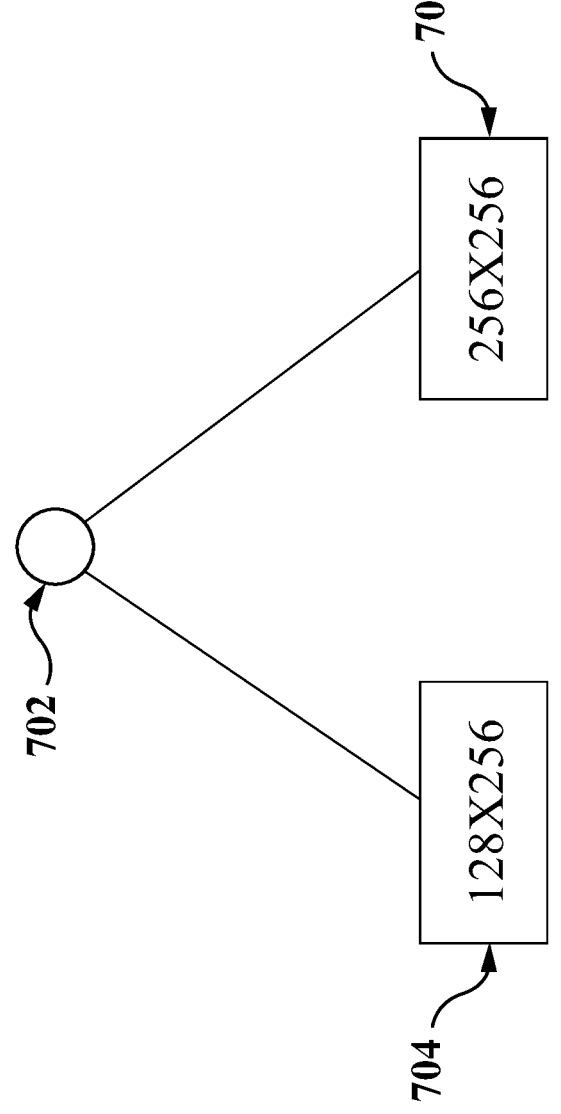
FIG. 7 illustrates a representative binary tree of HPPC, in accordance with various non-limiting embodiments of the present disclosure.

FIG. 7 illustrates a representative binary tree 700 of HPPC, in accordance with various non-limiting embodiments of the present disclosure. As shown the binary tree 700 may include a parent node 702 and two child nodes 704 and 706. The parent node 702 may be associated with the polar codes and the child nodes 704 and 706 may be associated with the product polar codes. In one example, a dimension of the child node 704 may be 128×256 and a dimension of the child node 706 may be 256×256.

Figure 8:
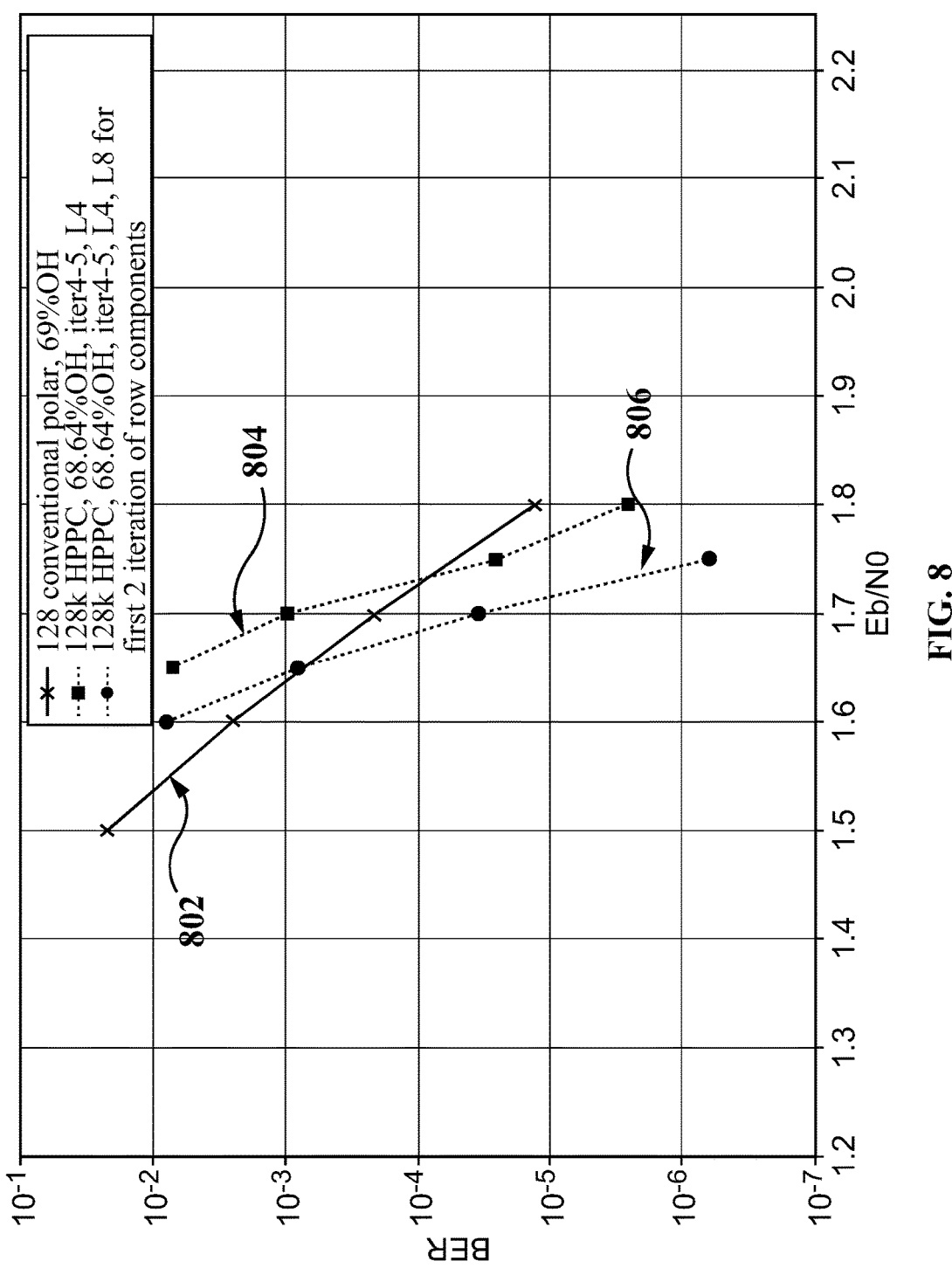
FIG. 8 illustrates BER performance of a 128K HPPC corresponding to the binary tree, in accordance with various non-limiting embodiments of the present disclosure.

FIG. 8 illustrates BER performance 800 of a 128K HPPC corresponding to the binary tree 700, in accordance with various non-limiting embodiments of the present disclosure. The BER performance 800 may include curves 802, 804, and 806. The curve 802 may be corresponding to 128K conventional polar codes. To evaluate the BER performance of the HPPC, in one embodiment, a number of iterations for the child node 704 with a dimension of 128×256 and the child node 706 with a dimension of 256×256 may be set to 4 and 5 respectively. Also, the list size for both the child nodes 704 and 706 may be set to 4. In another embodiment, a number of iterations for both the child nodes 704 and 706 may be increased to 5 and 6. In this embodiment, for the first 2 iterations, the list size may be set to 8 for row components and for the remaining iterations the list size may be set to 4. The BER performance of illustrated by the curves 804 and 806 corresponding to different embodiments of the HPPC may have better performance as compared to the curve 802 corresponding to conventional polar codes.

It is to be noted that a latency of the polar code decoded by fast SC-based decoders is proportional to the number of leaf nodes in the binary tree representation of the code. In the above embodiments, for polar code, the number of leaf nodes considering the special nodes is 3546 while for row and column components of the child node 704 and row and column component of the child node 706, the number of special nodes is 41, 6, 16 and 12, respectively. Therefore, if the iterative decoding of HPPC is taken into account, the latency of HPPC is about an order of magnitude lower than the polar code.

Thus, it may be said various embodiments of the present disclosure have improved latency as compared to latency associated with the conventional polar codes and are suitable for high-throughput applications. Unlike conventional polar code, HPPC based techniques have parallel decoding capability. Also, unlike the conventional polar codes, HPPC based techniques may have sharp BER slope because of large minimum distance. The HPPC based techniques have reduced error propagation issues as compared to the conventional long-length polar codes which makes the HPPC techniques a better candidate for soft inner codes in concatenation schemes. In addition to the above benefits, HPPC based techniques may benefit from the fast SC-based decoding algorithms of component codes based on the notion of special nodes.

FIG. 9 illustrates a flowchart of a process 900 for hybrid product polar codes-based communication method, in accordance with various non-limiting embodiments of the present disclosure.

As shown, the process 900 commences at step 902 where a transmitter receives a stream of information bits. As previously noted, the pre-processor 304 included in the receiver 300 may be configured to receive a stream of information bits 302.

The process 900 advances to step 904 where the transmitter reshapes the stream of information bits into at least a first rectangular information matrix $M_1$ of size $K_{r1} \times K_{c1}$ and a second rectangular information matrix $M_2$ of size $K_{r2} \times K_{c2}$ where $K_{r1}$ and $K_{r2}$ are the number of rows and $K_{c1}$ and $K_{c2}$ are the number of columns in the rectangular information matrices $M_1$ and $M_2$ respectively. As previously discussed, the pre-processor 304 included in the transmitter 300 may be configured to reshape the stream of information bits 302 into rectangular information matrices $M_1$ and $M_2$ of sizes $K_{r1} \times K_{c1}$ and $K_{r2} \times K_{c2}$ respectively.

The process moves to step 906, where the transmitter converts the rectangular information matrices $M_1$ and $M_2$ to 2D product polar code encoded matrices $X_1$ and $X_2$ respectively using product polar codes, the 2D product polar code encoded matrices $X_1$ and $X_2$ have a size of $N_{r1} \times N_{c1}$ and $N_{r2} \times N_{c2}$ respectively, where $N_{r1}$ and $N_{r2}$ are number of rows and $N_{c1}$ and $N_{c1}$ are number of columns of the encoded matrices $X_1$ and $X_2$ respectively. As noted previously, the product polar code encoder 306 included in the transmitter 300 may be configured to convert the rectangular information matrices $M_1$ and $M_2$ to a 2D product polar code encoded matrices $X_1$ and $X_2$ respectively using product polar codes, the 2D product polar code encoded matrices $X_1$ and $X_2$ respectively having sizes of $N_{r1} \times N_{c1}$ and $N_{r2} \times N_{c2}$ respectively.

The process advances to step 908, where the transmitter converts the 2D product polar code encoded matrices $X_1$ and $X_2$ to a stream of encoded bits X'. As noted previously, the product polar code encoder 306 included in the transmitter 300 may convert the 2D product polar code encoded matrices $X_1$ and $X_2$ to a stream of encoded bits X'.

Finally, at step 910, the transmitter encodes the stream of encoded bits X' to a stream of polar encoded bits X" using the polar codes. As noted above, the polar code encoder 308 included in the transmitter 300 may be configured to encode the stream of encoded bits X' to a stream of polar encoded bits X" using the polar codes.

FIG. 10 illustrates a flowchart of a process 1000 for hybrid product polar codes-based communication method, in accordance with various non-limiting embodiments of the present disclosure.

As shown, the process 1000 commences at step 1002 where a receiver receives a set of processed non-binary symbols S' from a transmitter. As discussed earlier, the receiver 500 may receive the processed non-binary symbols S' from the transmission media 316. The processed non-binary symbols S' may be transmitted over the transmission media 316 by the transmitter 300.

The process 1000 advances to step 1004 the receiver process the received set of processed non-binary symbols S' and reverse the operations performed by a transmitter symbol processor included in the transmitter. As noted previously, the receiver symbol processor 502 included in the receiver 500 may be configured to process the received set of processed non-binary symbols S' and reverse the operations performed by a transmitter symbol processor included in the transmitter 500 may be configured to process the received set of processed non-binary symbols S' and reverse the operations performed by the transmitter symbol processor 314 included in the transmitter 300.

The process 1000 advances to step 1006 where the receiver generates a set of extracted non-binary symbols S". As noted above, the receiver symbol processor 502 included in the receiver 500 may be configured to generate a set of extracted non-binary symbols S".

The process 1000 moves to step 1008 where the receiver converts the set of extracted non-binary symbols S" to LLRs. As discussed previously, the symbols-to-LLR convertor 504 included in the receiver 500 may be configured to convert the extracted non-binary symbols S" to a set of LLRs.

The process 1000 advances to step 1010 where the receiver rearranges the LLRs to reverse the effects of the interleaving performed by the transmitter. As discussed above, the deinterleaver 506 included in the receiver 500 may be configured to rearrange the LLRs to reverse the effects of the interleaving performed by the transmitter 300.

The process 1000 proceeds to step 1012 where the receiver performs successive cancellation-based polar decoding over the rearranged LLRs and generates polar decoded LLRs. As noted previously, the polar code decoder 508 included in the receiver 500 may be configured to perform successive cancellation-based polar decoding over the rearranged LLRs and generate polar decoded LLRs.

The process 1000 proceeds to step 1014 where the receiver rearranges the polar decoded LLRs to a 2D matrix of polar decoder LLRs of size $N_r \times N_c$, where $N_r$ is a number of rows and $N_c$ is a number of columns. As discussed previously, the polar code decoder 508 included in the receiver 500 may be configured to rearrange the polar decoded LLRs to a 2D matrix of polar decoder LLRs of size $N_r \times N_c$.

Finally at step 1016, the receiver performs a product polar decoding over the 2D matrix of polar decoder LLRs and generates information bits manifesting original information bits transmitted by the transmitter. As previously discussed, the product polar code decoder 510 included in the receiver may be configured to perform the product polar decoding over the 2D matrix of polar decoder LLRs and generate information bits 512 manifesting original information bits 302 transmitted by the transmitter 300.

It is to be understood that the operations and functionality of the communication system 100, constituent components, and associated processes may be achieved by any one or more of hardware-based, software-based, and firmwarebased elements. Such operational alternatives do not, in any way, limit the scope of the present disclosure.

It will also be understood that, although the embodiments presented herein have been described with reference to specific features and structures, it is clear that various modifications and combinations may be made without departing from such disclosures. The specification and drawings are, accordingly, to be regarded simply as an illustration of the discussed implementations or embodiments and their principles as defined by the appended claims, and are contemplated to cover any and all modifications, variations, combinations or equivalents that fall within the scope of the present disclosure.

What is claimed is:

1. A communication system comprising:
a transmitter including a product polar code encoder configured to:
receive a stream of information bits,
reshape the stream of information bits into at least a first rectangular information matrix $M_1$ of size $K_{r1} \times K_{c1}$ and a second rectangular information matrix $M_2$ of size $K_{r2} \times K_{c2}$ where $K_{r1}$ and $K_{r2}$ are the number of rows and $K_{c1}$ and $K_{c2}$ are the number of columns in the rectangular information matrices $M_1$ and $M_2$ respectively, convert the rectangular information matrices $M_1$ and $M_2$ to 2D product polar code encoded matrices $X_1$ and $X_2$ respectively using product polar codes, the 2D product polar code encoded matrices $X_1$ and $X_2$ having a size of $N_{r1} \times N_{c1}$ and $N_{r2} \times N_{c2}$ respectively, where $N_{r1}$ and $N_{r2}$ are numbers of rows and $N_{c1}$ and $N_{c2}$ are numbers of columns of the encoded matrices $X_1$ and $X_2$ respectively, and convert the 2D product polar code encoded matrices $X_1$ and $X_2$ to a stream of encoded bits X';
a polar code encoder configured to encode the stream of encoded bits X' to a stream of polar encoded bits X" using polar codes;
an interleaver configured to rearrange the stream of polar encoded bits X" to generate a stream of rearranged polar encoded bits X"',
a bits-to-symbol mapper configured to map the stream of rearranged polar encoded bits X"' to a set of non-binary symbols S; and
a transmitter symbol processor configured to process the set of non-binary symbols S to generate a set of processed non-binary symbols S' and transmit the set of processed non-binary symbols S' towards a receiver.

2. The communication system of claim 1, wherein the product polar codes have a code rate R less than a first threshold.

3. The communication system of claim 1, wherein the product polar codes have a code rate R greater than a second threshold.

4. A communication system comprising:
a receiver including:
a receiver symbol processor configured to:
receive a set of processed non-binary symbols S' from a transmitter, process the received set of processed non-binary symbols S' to reverse the operations performed by a transmitter symbol processor included in the transmitter, and
generate a set of extracted non-binary symbols S";
a symbols-to-log-likelihood ratio (LLR) convertor configured to convert the set of extracted non-binary symbols S" to LLRs;

a deinterleaver configured to rearrange the LLRs to reverse the effects of the interleaving performed by the transmitter;

a polar decoder configured to:

perform successive cancellation-based polar decoding over the rearranged LLRs and generate polar decoded LLRs, and rearrange the polar decoded LLRs to a 2D matrix of polar decoder LLRs of size $N_r \times N_c$, where $N_r$ is a number of rows and $N_c$ is a number of columns; and a product polar code decoder configured to perform a product polar decoding over the 2D matrix of polar decoder LLRs to generate information bits manifesting original information bits transmitted by the transmitter.

5. The communication system of claim 4, wherein the product polar code decoder performs product polar code decoding in an iterative manner.

6. The communication system of claim 4, wherein the product polar code decoder performs $N_r$-parallel fast successive cancellation list-based decoding of the rows of the 2D matrix of polar decoder LLRs.

7. The communication system of claim 6, wherein the product polar code decoder performs $N_c$-parallel fast successive cancellation list-based decoding of the columns of the 2D matrix of polar decoder LLRs.

8. The communication system of claim 4, wherein the product polar code decoder computes a priori information $L_{apr}(i, j)$ and a posteriori information $L_{app}(i, j)$ from the 2D matrix of polar decoder LLRs, where i and j represent ith row and jth column of the 2D matrix of polar decoder LLRs.

9. The communication system of claim 8, wherein the product polar code decoder computes the a posteriori information $L_{app}(i, j)$ as:

$$L_{app}(i, j) = \begin{cases} (1 - 2C^*(j))(PML_{minC_j^{cc}} - PML_0) & \text{if } C_j^{cc} \text{ exists} \\ (1 - 2C^*(j))\eta & \text{Otherwise} \end{cases}$$

where $\eta$ is an iteration dependent scaling factor, $C^*(j)$ is a candidate codeword, $PML_{min\ C_j^{cc}}$ is a minimum path metric among competitor codewords for bit location j, $PML_0$ is a minimum path metric associated with the most likely codeword in a list of candidate codewords provided a SCL algorithm, and $C_j^{cc}$ is a candidate codeword with a minimum squared distance in the list of candidate codewords.

10. The communication system of claim 8, wherein the product polar code decoder computes the information bits from the a priori information $L_{apr}(i, j)$ and the a posteriori information $L_{app}(i, j)$ as follows:

$$L_{ex}(i, j) = L_{app}(i, j) - L_{apr}(i, j)$$

where $L_{ex}(i, j)$ is extrinsic information representing the information bit at the ith row and jth column of the 2D matrix of polar decoder LLRs.

11. A communication method comprising:

receiving a stream of information bits;

reshaping the stream of information bits into at least a first rectangular information matrix $M_1$ of size $K_{r1} \times K_{c1}$ and a second rectangular information matrix $M_2$ of size $K_{r2} \times K_{c2}$ where $K_{r1}$ and $K_{r2}$ are the number of rows and $K_{c1}$ and $K_{c2}$ are the number of columns in the rectangular information matrices $M_1$ and $M_2$ respectively;

converting the rectangular information matrices $M_1$ and $M_2$ to 2D product polar code encoded matrices $X_1$ and $X_2$ respectively using product polar codes, the 2D product polar code encoded matrices $X_1$ and $X_2$ have a size of $N_{r1} \times N_{c1}$ and $N_{r2} \times N_{c2}$ respectively, where $N_{r1}$ and $N_{r2}$ are number of rows and $N_{c1}$ and $N_{c2}$ are number of columns of the encoded matrices $X_1$ and $X_2$ respectively;

converting the 2D product polar code encoded matrices $X_1$ and $X_2$ to a stream of encoded bits X';

encoding the stream of encoded bits X' to a stream of polar encoded bits X" using polar codes;

rearranging the stream of polar encoded bits X" to generate a stream of rearranged polar encoded bits X"';

mapping the stream of rearranged polar encoded bits X" to a set of non-binary symbols S;

processing the set of non-binary symbols S and generating a set of processed non-binary symbols S'; and transmitting the set of processed non-binary symbols S' towards a receiver.

12. The communication method of claim 11, wherein the product polar codes have a code rate R less than a first threshold.

13. The communication method of claim 11 wherein the product polar codes have a code rate R greater than a second threshold.

14. A communication method comprising:

receiving a set of processed non-binary symbols S' from a transmitter;

processing the received set of processed non-binary symbols S' and reversing the operations performed by a transmitter symbol processor included in the transmitter;

generating a set of extracted non-binary symbols S";

converting the set of extracted non-binary symbols S" to LLRs;

rearranging the LLRs to reverse the effects of the interleaving performed by the transmitter;

performing successive cancellation-based polar decoding over the rearranged LLRs and generating polar decoded LLRs;

rearranging the polar decoded LLRs to a 2D matrix of polar decoder LLRs of size $N_r \times N_c$, where $N_r$ is a number of rows and $N_c$ is a number of columns; and performing a product polar decoding over the 2D matrix of polar decoder LLRs and generating information bits manifesting original information bits transmitted by the transmitter.

15. The communication method of claim 14, wherein the product polar code decoding is performed in an iterative manner.

16. The communication method of claim 14 further comprising performing $N_r$-parallel fast successive cancellation list-based decoding of the rows of the 2D matrix of polar decoder LLRs.

17. The communication method of claim 16 further comprising performing $N_c$-parallel fast successive cancellation list-based decoding of the columns of the 2D matrix of polar decoder LLRs.

18. The communication method of claim 14 further comprising computing a priori information $L_{apr}(i, j)$ and a posteriori information $L_{app}(i, j)$ from the 2D matrix of polar decoder LLRs, where i and j represent ith row and jth column of the 2D matrix of polar decoder LLRs.

19. The communication method of claim 18 further comprising computing the a posteriori information $L_{app}(i, j)$ as:

$$L_{app}(i, j) = \begin{cases} (1 - 2C^*(j))(PML_{minC_j^{cc}} - PML_0) & \text{if } C_j^{cc} \text{ exists} \\ (1 - 2C^*(j))\eta & \text{Otherwise} \end{cases}$$

where $\eta$ is an iteration dependent scaling factor, $C^*(j)$ is a candidate codeword, $PML_{min\ C_j^{cc}}$ is a minimum path metric among competitor codewords for bit location j, $PML_0$ is a minimum path metric associated with the most likely codeword in a list of candidate codewords provided a SCL algorithm, and $C_j^{cc}$ is a candidate codeword with a minimum squared distance in the list of candidate codewords.

20. The communication method of claim 18 further comprising computing the information bits from the a priori information $L_{apr}(i, j)$ and the a posteriori information $L_{app}(i, j)$ as follows:

$$L_{ex}(i,j) = L_{app}(i,j) - L_{apr}(i, j)$$

where $L_{ex}(i, j)$ is extrinsic information representing the information bit at the ith row and jth column of the 2D matrix of polar decoder LLRs.

\* \* \* \* \*